(12) United States Patent
Schmid

(10) Patent No.: US 7,432,126 B2
(45) Date of Patent: Oct. 7, 2008

(54) SUBSTRATE WITH SEMICONDUCTOR LAYER, ELECTRONIC COMPONENT, ELECTRONIC CIRCUIT, PRINTABLE COMPOSITION AND METHOD FOR PRODUCTION THEREOF

(75) Inventor: Günter Schmid, Hemhofen (DE)

(73) Assignee: Infineon Technologies AG (DE)

( * ) Notice: Subject to any disclaimer, the term of this patent is extended or adjusted under 35 U.S.C. 154(b) by 91 days.

(21) Appl. No.: 10/432,767

(22) PCT Filed: Nov. 30, 2001

(86) PCT No.: PCT/DE01/04511

§ 371 (c)(1), (2), (4) Date: Sep. 26, 2003

(87) PCT Pub. No.: WO02/45183

PCT Pub. Date: Jun. 6, 2002

(65) Prior Publication Data

US 2004/0082098 A1  Apr. 29, 2004

(30) Foreign Application Priority Data

Nov. 30, 2000  (DE) .............................. 100 59 498

(51) Int. Cl.
*H01L 51/40*  (2006.01)
(52) U.S. Cl. .................... 438/99; 438/763; 438/780; 438/781; 438/783
(58) Field of Classification Search ............... 257/223, 257/227, 291, 292, 439, 443, 655; 438/149, 438/510, 530, 537, 557, 562, 564
See application file for complete search history.

(56) References Cited

U.S. PATENT DOCUMENTS

| | | | | |
|---|---|---|---|---|
| 3,864,715 A | * | 2/1975 | Mastrangelo | ............... 257/49 |
| 3,990,098 A | * | 11/1976 | Mastrangelo | ............... 257/43 |
| 4,595,515 A | * | 6/1986 | Wakino et al. | ............... 252/62 |
| 4,947,219 A | | 8/1990 | Boehm | |
| 5,432,635 A | * | 7/1995 | Tanahashi et al. | ........... 359/326 |
| 5,624,741 A | | 4/1997 | Scott | ........................ 428/210 |
| 5,672,214 A | | 9/1997 | Arthur et al. | |
| 5,868,869 A | | 2/1999 | Albright et al. | |
| 5,943,354 A | * | 8/1999 | Lawandy | ..................... 372/39 |
| 5,994,997 A | * | 11/1999 | Brown et al. | ............... 338/309 |
| 6,241,819 B1 | * | 6/2001 | Bhargava et al. | ............. 117/68 |

(Continued)

FOREIGN PATENT DOCUMENTS

DE  195 02 541 A1  8/1996

(Continued)

OTHER PUBLICATIONS

Pethkar et al., Deposition and characterization of CdS nanoparticle/ polyaniline composite films, Thin Solid Films 349, pp. 105-109, 1999.

(Continued)

*Primary Examiner*—Zandra Smith
*Assistant Examiner*—Khanh B Duong
(74) *Attorney, Agent, or Firm*—Altera Law Group, LLC (57) ABSTRACT

A substrate comprises at least one semiconductor layer applied to a substrate material, whereby the semiconductor layer comprises an inert matrix material, in which an inorganic semiconductor material is embedded in particle form.

27 Claims, 7 Drawing Sheets

U.S. PATENT DOCUMENTS

| | | | |
|---|---|---|---|
| 6,281,315 B1 * | 8/2001 | Gonzalez et al. | ............ 526/266 |
| 6,331,811 B2 * | 12/2001 | Shibuya et al. | .............. 338/308 |
| 6,344,662 B1 * | 2/2002 | Dimitrakopoulos et al. | ... 257/40 |
| 6,617,784 B1 * | 9/2003 | Abe et al. | ................... 313/506 |

FOREIGN PATENT DOCUMENTS

| | | |
|---|---|---|
| DE | 198 54 938 A1 | 6/2000 |
| DE | 199 05 694 A1 | 8/2000 |
| EP | 0 528 662 A | 2/1993 |
| EP | 0 777 279 A2 | 11/1996 |
| JP | 2000022129 | 1/2000 |
| JP | 2002100759 | 4/2002 |
| WO | WO 99/19900 | 4/1999 |
| WO | WO 99/39373 | 8/1999 |
| WO | WO 00/20916 | 4/2000 |

OTHER PUBLICATIONS

Yang et al., Blue luminescence from amorphous GaN nanoparticles synthesized in situ in a polymer. Applied Physics Letters, vol. 74, No. 16, pp. 2262-2264, (1999).

Huang et al., Photoluminescence and electroluminescence of ZnS:Cu nanocrystals in polymeric networks. Applied Physics Letters, vol. 70, No. 18 (1997), pp. 2335-2337.

Kuczkowski A, The prospects for Polyester polymer-CdS powder composites in photoelectronic device applications, Journal of Physics D: Applied Physics 22, No. 11, pp. 1731-1735, Nov. 14, 1989.

Trindade et al., Preparation and Optical Properties of CdSe/Polymer Nanocomposites, Scripta Materialia, vol. 43, No. 6, pp. 567-571, Aug. 28, 2000.

Ginger D. S. et al., Charge Separation in Conjugated-Polymer/Nanocrystal Blends, Synthetic Metals, vol. 101, pp. 425-428, Elsevier Sequoia, Lausanne (1999), XP-000879469.

Greenham, N.C., et al., Charge Separation and transport in conjugated polymer/cadmium selenide nanocrystal composites studied by photoluminescence quenching and photoconductivity, Synthetic Metals, vol. 84, pp. 545-546, Elsevier Sequoia, Lausanne (1997), XP-002060695.

Baraton, Marie-Isabelle, et al., Drifts characterization of a nanostructured gallium nitride powder and its interactions with organic molecules, Materials Science and Engineering, vol. B50, pp. 42-45, Elsevier Sequoia, Lausanne, (1997).

* cited by examiner

SUBSTRATE WITH SEMICONDUCTOR LAYER, ELECTRONIC COMPONENT, ELECTRONIC CIRCUIT, PRINTABLE COMPOSITION AND METHOD FOR PRODUCTION THEREOF

BACKGROUND OF THE INVENTION

1. Field of the Invention

The present invention relates to a substrate having a semiconducting layer, to an electronic component which includes this substrate, to an electronic circuit which includes at least one electronic component of this type, to a printable composition and to processes for producing a semiconducting substrate.

2. Description of the Related Prior Art

The semiconducting (active) components of microchips usually consist of perfect single crystals of high-purity semiconducting inorganic substrates/materials, such as silicon or germanium. The functionality of these components is based on the electrical interface properties between differently semiconducting layers or domains which are produced by n-doping or p-doping of the substrates. However, this targeted doping requires complex lithographic masking, etching and ion implantation processes, including the patterning of the substrates with the aid of photoresists. However, components produced in this way, on account of the complex fabrication methods, are not suitable for applications in which the price of the components is the primary factor.

One possible way of producing semiconducting substrates and components based thereon which can be implemented without complex doping measures in semiconductor fabrication consists in using semiconducting organic polymers, such as polyvinylcarbazoles, polythiophenes, polyanilines, poly-p-phenylenes and poly-para-phenylvinylidenes (PPVs) and the like. Substrates based on semiconducting organic polymers of this type can be produced, as described in PCT applications WO 99/39373 or WO 99/19900, by semiconducting organic polymers which can be used as n-conductors or p-conductors being dissolved in an organic solvent and these mixtures being printed onto a substrate in layers by means of conventional inkjet printing technology. However, drawbacks of using organic polymers of this type include their low conductivity or the low charge carrier mobility, the fact that they are relatively expensive to produce and the low stability of doped materials with respect to environmental influences. Therefore, in particular they are not suitable for low-cost applications for semiconducting components and/or circuits.

Furthermore, German laid-open specifications DE 198 54 938 and DE 199 05 694 have disclosed a component which includes a first layer, a second layer and an interlayer located therebetween, the interlayer containing a first and/or a second material, as well as at least one substance which has a different conductivity than the first and/or second material being colloidally dissolved therein.

German laid-open specification DE 195 02 541 has disclosed an electroluminescent system which includes a light-emitting substance. In this context, it is provided that the light-emitting substance is formed by inorganic particles with grain sizes in the nanometer range which are connected to one another by means of organic spacers.

European patent application EP 0 777 279 describes an interlayer in electroluminescent arrangements which contain finely particulate inorganic nanoparticles.

Furthermore, PCT application WO 00/20916 has disclosed electrical, chemical and mechanical structures which are based on nanoparticles.

Thin Solid Films, 349 (1999), pages 105-109 has disclosed the deposition and characterization of composite layers of CdS and polyanilines. Applied Physics Letters, 74 (1999), No. 16, pages 2262-2264 describes the synthesis of amorphous GaN nanoparticles by the in situ thermal decomposition of cyclotrigallazane enclosed in a polymer and the photoluminescence of the nanoparticles. Applied Physics Letters, 70 (1997), 18, pages 2335-2337 investigates the photoluminescence and electroluminescence of ZnS:Cu nanocrystals in polymeric networks.

BRIEF SUMMARY OF THE INVENTION

Therefore, the invention is based on the problem of providing a semiconducting substrate and an electronic component which can be produced in a simple and inexpensive way.

The problem is solved by a semiconducting substrate and an electronic component having the features described in the independent patent claims. A substrate of this type is a substrate which includes at least one semiconducting layer applied to a substrate material, the semiconducting layer including an inert matrix material in which an inorganic semiconducting material is embedded in particle form. An electronic component is a component which includes a substrate as defined above.

An electronic circuit is a circuit constructed using at least one component of this type.

Therefore, the present invention is based on the discovery that, for the semiconductor functionality of a component such as a microchip, it is not necessary for the differently (n- and p-) semiconducting layers to be formed as intact solid bodies (polycrystalline material, single crystals) of an inorganic semiconductor (i.e. as a bulk material), but rather the charge transport required to achieve the semiconductor properties can take place via the suspended particles which adjoin one another in the matrix. These semiconductors have a quality and performance which are similar to those achieved by polycrystalline silicon substrates.

In addition to these substrates, the present invention also provides a process for producing a substrate which includes at least one semiconducting material applied to a substrate material, which comprises the following steps:

(a) providing an inert matrix material,
(b) mixing a pulverulent, inorganic semiconducting material with the inert matrix material,
(c) applying the mixture which contains the matrix material to the substrate material,
(d) solidifying the matrix material, the semiconducting inorganic material being embedded in the matrix material.

Any known inorganic semiconducting material can be used in the present invention. However, inter alia for cost reasons, it is preferable to use conventional semiconductor materials, such as silicon, silicon carbide, germanium, gallium arsenide, gallium nitride, indium phosphide, cadmium selenide or mixtures thereof, in the present invention. A particularly preferred material is polycrystalline silicon, which is produced, inter alia, as waste in the production of silicon single crystals using the zone melting process and which merely needs to be comminuted in order to be used as the inorganic semiconductor material in the present context. The semiconductor material may be doped or undoped. As a result, the present invention offers up a useful way of recycling waste materials from traditional semiconductor manufacture. A further advantage of the materials listed above is their brittleness, which facilitates the comminution process which is generally required for production of the substrates.

The particle size of the inorganic semiconducting material used here is generally between 100 µm and 10 nm, preferably between 50 µm and 0.01 µm or 0.05 µm. However, the particle size is not restricted to this range. Rather, in the present invention it is on the one hand also possible to use larger particles, provided that they can still effect a sufficient charge transport to achieve the desired semiconductor properties. On the other hand, it is also possible to use smaller particles, provided that they do not have an adverse effect on the semiconductor properties as a result of the occurrence of quantum mechanical effects, as is the case, for example, with what are known as quantum dots.

Figure 6:
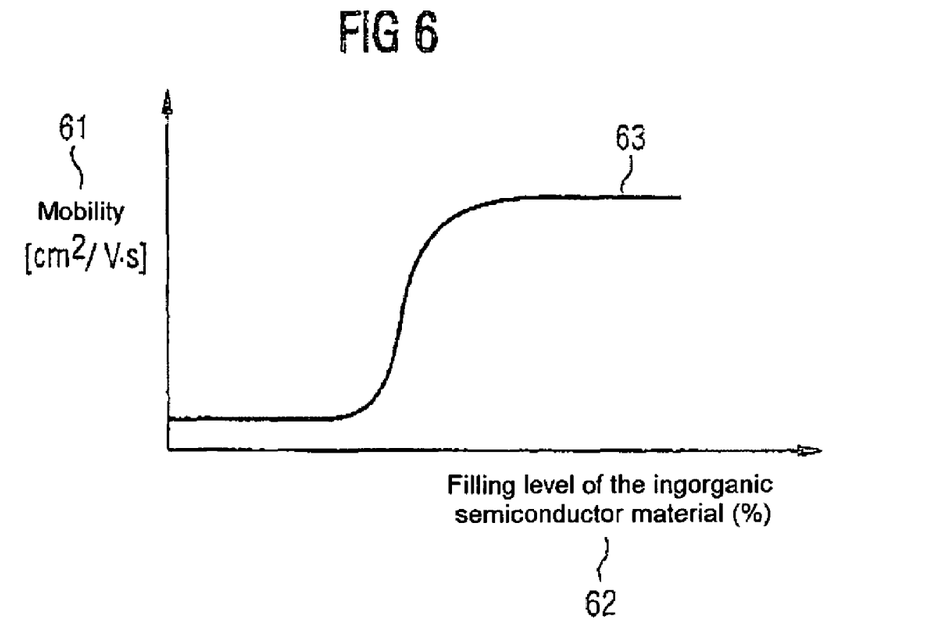
FIG. 6 shows an exemplary and diagrammatic illustration of the charge carrier mobility in a semiconducting layer of a substrate plotted as a function of the filling level of the inorganic semiconducting material in the layer.

The inorganic semiconducting material content (filling level) in the semiconducting layers of the substrate is in each case approx. 20 to approx. 90% by volume, preferably about 30 to about 70% by volume, based on the total volume of the semiconducting layer. Accordingly, the matrix material, including the further constituents which may be present, is present in the semiconducting layer in an amount of approx. 80 to approx. 10% by volume, preferably about 70 to 30% by volume. The inorganic semiconducting material filling level is dependent, inter alia, on the desired mobility of the charge carriers. There is generally a sigmoidal or similar relationship 63 (cf. FIG. 6) between the filling level 62 of the semiconducting layer and the mobility of the charge carriers 61 (in $cm^2/V \cdot s$), and consequently the desired inorganic semiconductor material filling level can be determined by means of a simple series of tests. Surprisingly, the charge carrier mobility is very high. For example, the layers described here, in a field-effect transistor arrangement, usually have mobilities in the range from $10^{-1}$ to $1 \cdot 10^4 cm^2/V \cdot s$). A mobility of 1.5 $cm^2/V \cdot s$ is sufficient for most of the applications described below.

The substrate disclosed here is distinguished by the semiconducting layer having a high chemical and physical stability with respect to environmental influences, such as the action of temperature, UV radiation, high concentrations of salt and the like. For example, the electrical properties of the semiconducting layers are retained even after temperature and/or salt spray tests. In what are known as tape tests, in which the bonding to the substrate is tested, the semiconductor layers do not reveal any delamination or only slight removal of the particles. Furthermore, the semiconducting layers have a high resistance to mechanical abrasion. The thickness of the layers is highly variable, generally lying in the range from 0.1 µm to approx. 200 µm, preferably 1 µm to 5 µm.

In the context of the present invention, an inert matrix material is in principle any material which is not itself conductive and which embeds the inorganic particles in the solid state without having an adverse effect on the electrical charge transport, which takes place, in a similar manner to the situation in a solid semiconductor, by means of the semiconductor effects which occur at the grain boundaries between the particles. The inert matrix materials used here may be organic polymers (polymer materials), inorganic materials and mixtures thereof.

Examples of organic polymer materials include conventional dielectric synthetic plastics, such as epoxy resins, polyalkylenes, such as polyethylene or polypropylene resins, polystyrenes, polyurethanes, polyimides, polybenzoxazoles, polythiazoles, polyethers, polyether ketones, polyacrylates, polyterephthalates, polyethylene naphthalate, polycarbonates of all types and other known plastics of this type, as described, for example, on pages 8 to 10, 110 to 163 in Kunststoff-Kompendium [Plastics Compendium], 2nd Edition 1988, Franck/Biederbick, Vogel-Buchverlag Würzburg, ISBN 3-8023-0135-8. Furthermore, it is also possible to use natural polymer materials, such as natural or rubber latex, as organic polymer material. The polymer materials which can be used here may be homopolymers, copolymers and mixtures of polymers and copolymers, known as polymer blends. The term polymer materials used in the present context, in addition to the polymeric end products, also includes the corresponding prepolymers thereof.

The organic polymers used here are preferably materials which can be dried and cured, preferably IR- and/or UV-curable polymers, such as polystyrenes, epoxy resins, polyalkylenes, polyimides, polybenzoxazoles, polyacrylates.

Inorganic matrix materials which can be used in the invention are preferably inorganic ceramic materials. An inorganic ceramic material which can be used as an inert matrix material in the present context is understood as meaning firstly a raw material used for the production of earthenware, ceramic products, pottery or porcelain. Examples of such materials include silicates and clay minerals, such as kaolin or illite, relatively impure ceramic clays, which contain, for example, relatively large quantities of quartz, mica or sand. In the context of the present invention, fluxing or leaning agents, such as quartz or fluorspar, which are likewise used as raw materials, for example in the production of porcelain, are also to be understood as ceramic materials. Further groups of ceramic materials which can be used in the present context are what are known as green ceramics, which are usually distinguished by a low melting point of approx. 200° C. to 400° C. or just above, as well as the ceramics which are known as spin-on-glass materials, such as for example Accuglass™ produced by AlliedSignal™.

In a further embodiment, the semiconducting layers of the substrate described here may contain an auxiliary semiconducting organic material as matrix material. This material may be organic semiconducting polymers. Examples of polymers of this type which may be mentioned here include polythiophene, polyaniline, poly-p-phenylenes, poly-p-phenylvinylidenes or polypyrrole or phthalocyanines. It is also possible for monomeric or low-molecular-weight, auxiliary (semiconducting) organic additives, such as pentacene or oligothiophenes (for example with 1 to 10 thiophene units, preferably 6 thiophene units), to be present as organic material of this type. The amount of auxiliary polymers and additives of this type in the semiconducting layer is generally approximately 0.5 to 25% by volume, preferably at most 10% by volume.

In an advantageous configuration of the invention, the matrix material emits light.

In the present invention, it is in principle possible for any material to which a semiconducting layer can be permanently applied to be used as substrate material (carrier material) for the fabrication of electrical circuits and components. Examples of suitable substrate materials include insulators, such as paper, plastic films, ceramics, glass or silica gel plates, also metal or plastic-coated metal. In an advantageous configuration of the invention, the conducting substrates are transparent, for example coated with indium tin oxide (ITO). It is also possible for substrate materials such as n-doped or p-doped silicon (which are themselves electrically conducting or semiconducting) to be used for the fabrication of electric circuits.

It is possible to fabricate any desired electrical component or any desired circuit using the semiconducting materials and substrates described here. Examples of such components include transistors, diodes, light-emitting diodes, which for their part are used in microchips, displays based on light-emitting diodes, solar cells, passive components, etc. In the component of the invention, it is preferable for all the semiconductor junctions to be formed by contacts between the layers described here (cf. for example FIGS. 2 to 4). In the present context, a semiconductor junction is understood as meaning both junctions between semiconducting regions doped with different conductivity types, e.g. between n-doped and p-doped regions, and junctions between regions with different dopant concentrations of the same conductivity type, e.g. n− and n+−. This configuration of the semiconductor junctions in the component described here has the advantage that the contact resistances are low and the on/off ratio is good.

On account of the achievable charge carrier mobilities described above, the performance of components which are fabricated using semiconducting layers is generally in no way inferior to that of conventional components. If desired, the electrical properties of the electronic components and semiconductor circuits can be improved by means of an additional conditioning step/sintering step at a temperature preferably in the range from 150° C. to 700° C., preferably, for plastics materials, in a range from 150° C. to 400° C.

The components fabricated as explained here have wide application areas. On account of their low fabrication costs, they are preferably used in labeling technology, for example for the electrical labeling of goods for logistics and security purposes, in particular for products with a high market volume and/or a low price.

Examples of applications in this context include replacing or supplementary bar codes, electronic postage stamps, electronic price tags or shelf life indicators, security features which can be scanned remotely or other applications which operate on the basis of the transponder principle for contact-free exchange of information. A further preferred high-volume application for the components according to the invention is the portion of smartcards which are not subject to high demands. Examples include display drivers or active security features.

A further element of the present invention is formed by the printable composition (formulation) which can be used to produce the substrate and electronic component, since it contains a matrix material which is inert with respect to semiconducting materials and a pulverulent inorganic semiconducting material.

A printable composition of this type may consist exclusively of a meltable matrix material and inorganic semiconducting particles dispersed therein. Examples of suitable meltable matrix materials of this type are thermoplastics, such as polystyrene, or inorganic matrix materials, such as the green ceramics, which are distinguished by their low melting point. A specific example of a composition of this type is a mixture of polystyrene powder and p-conducting silicon particles (cf. Fabrication Example 1), which is applied to a substrate material with the aid of a heated nozzle (instead of being discharged as a solution as in Fabrication Example 1). Another example is a plastic material, such as a hot-melt adhesive, which is filled/mixed with particles of inorganic semiconductor material, such as polycrystalline silicon.

Since, furthermore, the printable formulation used in the present invention may be based on known inks and colors for inkjet technology, this printable formulation is also referred to below as an ink or color.

A printable composition may be based on an aqueous liquid, an organic liquid, a mixture of at least two organic liquids or an organic-aqueous liquid mixture. This liquid can act as a solvent, with the result that the inert matrix material may be either dispersed or dissolved in the composition. Inorganic matrix materials are preferably present in the inks in the form of a dispersion; however, they may also be dissolved in an aqueous or organic solution. One example of a dissolved inorganic matrix material is sodium (ortho)silicate, which is solidified by the addition of acid and can then be sintered in a conditioning step to discharge water.

Organic matrix materials may be present in dissolved or dispersed form.

When organic polymers are used as matrix material, these dispersions may be either primary dispersions, in which the polymerization of the corresponding base monomers takes place directly in the liquid phase (emulsion polymerization, as used, for example, with acrylates), or secondary dispersions, in which polymers which have already been prefabricated are present. Secondary dispersions of this type are used, for example, with polyurethanes or polyvinyl ethers. The dispersing agents used may equally be printable aqueous and non-aqueous dispersing agents. The choice of dispersing agent is dependent, inter alia, on the polymer materials selected and the desired application/printing process. Examples of suitable dispersing agents are all types of surfactants.

In a preferred embodiment, the organic polymer used as matrix material is dissolved in the ink. In the context of the present invention, it is in principle possible for the organic solvent used to be any of the organic solvents and solvent mixtures which are known for polymers/plastics, for example tetrahydrofuran, methylene chloride, chloroform, N-methylpyrrolidone, xylenes, γ-butyrolactone, methoxypropyl acetate, ethyl lactate, ethyl acetate or cyclohexanone.

In the printable composition, the inert matrix material and the inorganic semiconducting material are preferably present in quantities which are such that the semiconducting layer or semiconducting layers of a substrate which are produced using the printable composition have an inorganic semiconducting material content of 20 to 90% by volume, based on the total volume of the dried layer after removal of the solvent.

The ink/color described here may furthermore contain printing auxiliaries as well as any known catalysts and auxiliary substances (thixotropy adjusters, viscosity adjusters, corrosion inhibitors) which may be required for the polymerization or curing of polymeric matrix materials.

In the present context, printing auxiliaries are to be understood as meaning both compounds which help to improve the application of the ink to the substrate, i.e. the printing operation itself, and substances which promote the homogeneous distribution of the matrix on the substrate. Auxiliaries of this type are generally only present in small quantities, i.e. usually below 3% by volume, in the ink.

In addition to the compounds described above, the printable formulation of the present invention may also contain additives which are standard in plastics technology, such as stabilizers, anti-aging agents and the like.

The ink disclosed is preferably used in combination with a process as claimed here for the production of a substrate having at least one semiconducting material applied to a substrate material.

A first process comprises the following steps: (a) providing an inert matrix material, (b) mixing a pulverulent, inorganic semiconducting material with the inert matrix material, preferably until a homogeneous mixture has formed, (c) applying the mixture to the substrate material, and (d) solidifying the matrix material, the semiconducting inorganic material being embedded in the matrix material.

In a preferred configuration of this process, the mixture which results in step (b) is a (homogeneous) suspension. In this configuration, therefore, in step (b) of the process the pulverulent, inorganic semiconducting material is suspended in the inert matrix material until a (homogeneous) suspension has formed, and in step (c) the suspension which contains the matrix material is applied to the substrate material.

The providing and mixing operations in steps (a) and (b), respectively, can be carried out in such a manner that inert matrix material in solid form (for example in pulverulent or granulated form) is provided, then pulverulent, inorganic semiconductor material is added, and after that the mixture is homogeneously milled. The result is then a solid, pulverulent mixture (of solids). A procedure of this type is also possible, for example, when the inert matrix material used is polystyrene. A further example is a plastics material, such as hot-melt adhesive granules filled with particles of inorganic semiconductor material. Hot-melt adhesives of this type are generally low-melting thermoplastics, i.e. plastics with a melting point of preferably approx. 150° C. or below.

However, the provision of the inert matrix material in step (a) may also be carried out, for example, by melting an inert matrix material. Examples of suitable meltable matrix materials include plastics, such as polystyrene, or inorganic matrix materials, such as the green ceramics described above. With this procedure, the result in step (b) is a suspension which can be produced by mixing the pulverulent inorganic semiconducting material (e.g. polycrystalline silicon) into the melt.

The application of the mixture or suspension of inert matrix material and semiconducting inorganic semiconductor material in step (c) can, with the procedures described above, be carried out by the mixture or suspension being heated, so that it becomes able to flow or can be printed, if it is not already able to flow after step (b).

In a preferred embodiment of the production process described above, in process step (a) the inert matrix material is provided (contained) in a liquid. Consequently, in this embodiment, in step (b) the pulverulent, inorganic semiconducting material is then suspended in the liquid until a homogeneous suspension has formed, containing both the matrix material and the semiconducting material.

In the present invention, the production of the suspension from inorganic semiconducting material and the liquid which contains the inert matrix material may take place in any desired known way (e.g. by means of mixing/stirring techniques), provided that sufficient homogenization (milling together) is achieved.

For the application to the substrate material, the suspension produced in step (b) is preferably transferred to a suitable printing or spraying device. The application can likewise be carried out using any known and suitable process. By way of example, spraying processes for metallic inks based on aqueous and/or organic solvents which are otherwise used to produce shields in housing technology can be used for this purpose.

In this context, it is preferable to use printing processes, such as pad printing, screen printing, stencil printing or conventional inkjet printing processes, since in particular the latter can achieve a resolution of at least 1200 dpi (20 μm) without problems, which is sufficient for the abovementioned application purposes for circuits which have been printed in accordance with the invention.

A further printing process which can also be used in the present invention is offset printing. Offset printing requires two liquid phases (emulsions) which can only be mixed with one another with difficulty; in this case, the first liquid phase may, by way of example, be an aqueous phase and the second an organic phase which contains the inert matrix material and particulate inorganic semiconductor material. In offset printing, these two phases are first of all transferred to a printing plate which is structured with hydrophilic and hydrophobic regions, with the result that the two phases are separated (from one another). Then, the structures produced in this way can be transferred in a targeted way to a substrate material used here.

If the printable compositions described here are in the form of a solid, pulverulent mixture, e.g. as a mixture of pulverulent n-semiconducting or p-semiconducting silicon and a granulated/pulverulent plastic, laser printing can also be used to apply the compositions, i.e. as a printing process, since these compositions correspond to a conventional toner used for laser printing. With laser printing processes of this type it is likewise possible to achieve a resolution of more than 1200 dpi without problems.

The matrix material which has been applied to the carrier material as described above is generally solidified by removing the liquid which contains the matrix material. In this case, the liquid is preferably removed by drying. The drying is preferably carried out by irradiation with infrared light (IR), since this irradiation on the one hand can be carried out easily in series production of the substrates, and on the other hand, if heat-curable organic polymer materials (plastics), such as epoxy resins, are used, it also promotes or effects the curing of the matrix material. However, depending on the type of matrix material used, it is also possible for other known drying or solidification processes (hardening processes) to be used. By way of example, the drying may also take place in vacuo, i.e. by means of vacuum techniques. If UV-curable plastics are used, the curing is preferably effected by UV irradiation.

As an alternative to the process described above, a substrate which includes at least one semiconducting material applied to a substrate material can be obtained by a process which includes the following steps:

(a) providing an inert matrix material,
(b) applying the matrix material to the substrate material,
(c) suspending a pulverulent, inorganic semiconducting material in the inert matrix material until a homogeneous suspension has formed, in which the semiconducting inorganic material is embedded in the matrix material.

A process of this type is, by way of example, configured in such a way that the inert matrix material used is a thermoplastic, such as polystyrene, polyethylene or polypropylene, which is applied to a substrate material as a melt, for example, and then, in step (c), the suspension is formed by particles of an inorganic semiconductor being rolled into the layer of the matrix material. This process is particularly advantageous in particular with a view to the formation of the boundary layer between the substrate and the semiconducting layer, since it enables the semiconducting particles to be embedded only in the upper region of the semiconducting layer, with the result that the region which directly adjoins the substrate material remains nonconductive.

Furthermore, this process may, as step (d), include the solidification of the matrix material on the substrate material.

The process described here can be used to provide a semiconducting substrate with any desired pattern by semiconducting layers being applied to the desired substrate material in any desired (geometric) arrangement. For example, substrates having a plurality of semiconducting layers on top of one another, i.e. multilayer substrates, or layers arranged in a grid/lattice can be produced without problems. With the process described above, the "printing layout" for patterning can easily be changed.

BRIEF DESCRIPTION OF THE DRAWINGS

Exemplary embodiments of the present invention are explained further in the following figures and examples. In the drawing.

DETAILED DESCRIPTION OF THE INVENTION

Exemplary Embodiment 1

Figure 1A:
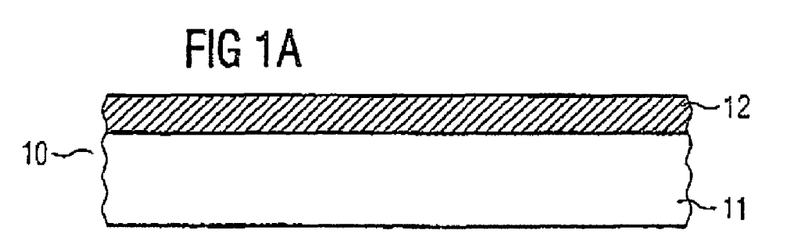
FIGS. 1A and 1B show a sectional view through a substrate of the present invention.
Figure 1B:
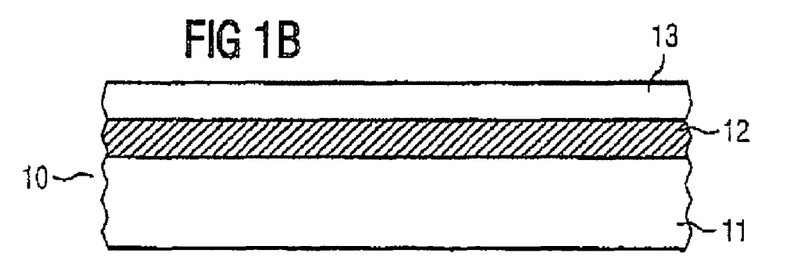
Figure 1C:
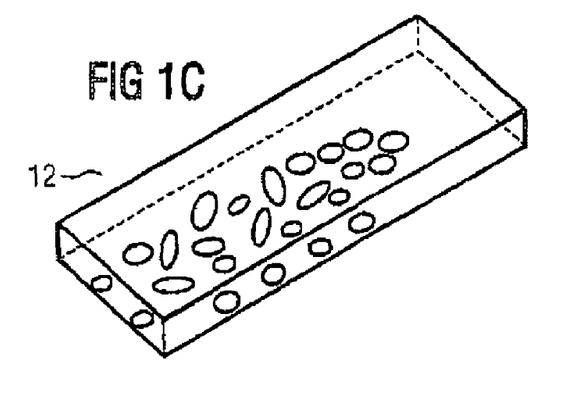
FIG. 1C diagrammatically depicts a semiconducting layer described here.

This example shows a substrate as presented in FIG. 1. FIGS. 1A and 1B show a sectional view through the substrate 10, in which one or two semiconducting layers 12, 13 have been applied to the carrier material 11. FIG. 1C diagrammatically depicts the semiconducting layer 12 made from inert matrix material with inorganic semiconductor material dispersed therein.

Exemplary Embodiment 2

Figure 2:
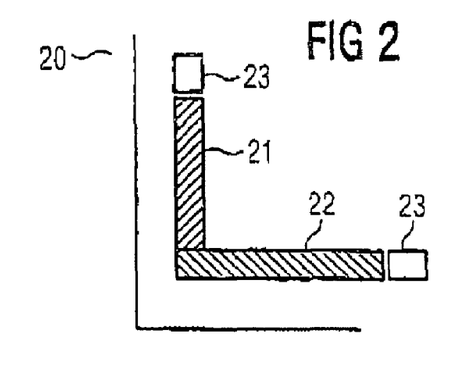
FIG. 2 shows a diode produced in accordance with Fabrication Example 1.

This example shows a diode 20 which has been produced in accordance with Fabrication Example 1 and is represented in FIG. 2. It includes a first semiconducting layer 21, in which p-conducting particulate silicon is embedded in a polystyrene matrix, and a second semiconducting layer 22, in which n-conducting particulate silicon is embedded in a polyacrylic acid matrix, the layer 22 being arranged on the one hand perpendicular to the first layer 21 and on the other hand (in order to increase the contact surface area) on the first layer 21. Furthermore, in the diode 20, contact is made with the layers 21 and 22 by means of a commercially available Cu/Ag ink 23.

Exemplary Embodiment 3

This example shows a metal oxide semiconductor field effect transistor (MOSFET) as shown in FIG. 3.

Figure 3A:
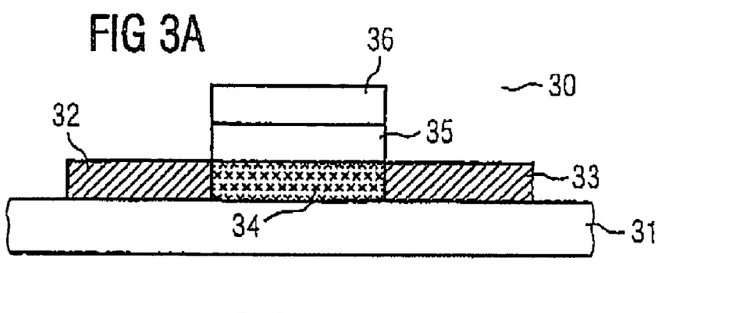
FIGS. 3A to 3D show a MOS (metal oxide semiconductor) field-effect transistor (MOSFET) of the present invention.

In the MOSFET 30 shown in FIG. 3A, two layers 32 and 33 of an n-conducting pulverulent semiconductor material which is dispersed in an inert matrix material and a layer 34 of p-conducting semiconductor material embedded in an inert matrix material have been applied to a substrate material 31. The layer 34 is arranged between the two layers 32 and 33 and is in contact with the two layers. The layer 34 serves as the channel region of the MOSFET. An oxide layer 35, on which there is a metallic gate 36, has been applied to the layer 34. The oxide layer 35 may be an oxide layer as found in conventional MOSFETs. However, the layer 35 is preferably a layer made from a printable material, such as a dielectric plastic or a spin-on-glass material, so that a component 30 which is analogous to a conventional MOSFET is formed. The metallic gate is, for example, a printable Cu/Ag ink.

Figure 3B:
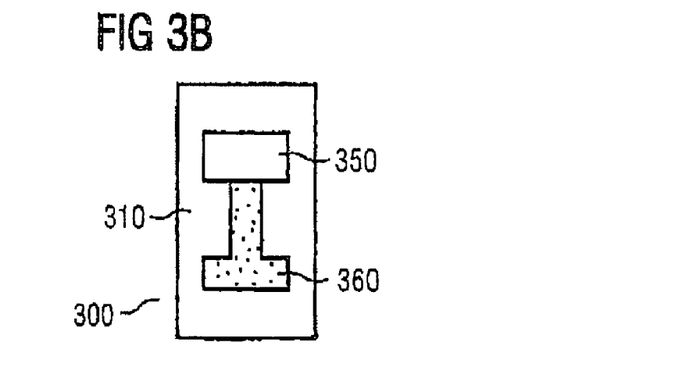
Figure 3C:
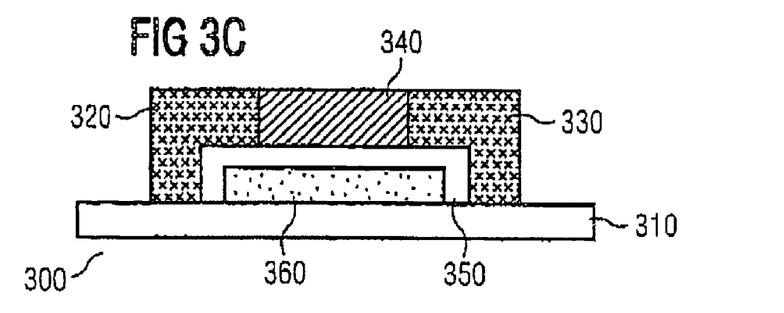

With the component 300 as shown in FIGS. 3B and 3C, corresponding to a MOSFET (FIG. 3B shows a plan view and FIG. 3C shows a sectional view), the substrate material 310 is a copper-patterned printed circuit board (base material FR4) on which there is a copper ink as metallic gate 360, and a plastic dielectric 350, which corresponds to an oxide layer of a MOSFET, printed thereon and two layers 320 and 330 of a p-conducting pulverulent semiconductor material, which is dispersed in an inert matrix material, as well as a layer 340 of n-conducting semiconductor material embedded in an inert matrix material.

Figure 3D:
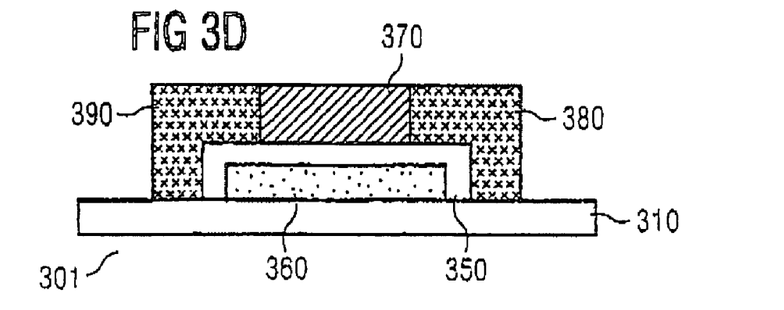

A further component 301 is shown in FIG. 3D. In this component, the substrate material 310 is likewise a copper-patterned conventional printed circuit board, the copper patterning itself forming the metallic gate 360. Printed on this is a plastic dielectric 350, an undoped (intrinsic) semiconductor 370, such as pure silicon or germanium, and two layers 380 and 390 of a Cu/Ag ink.

Exemplary Embodiment 4

Figure 4:
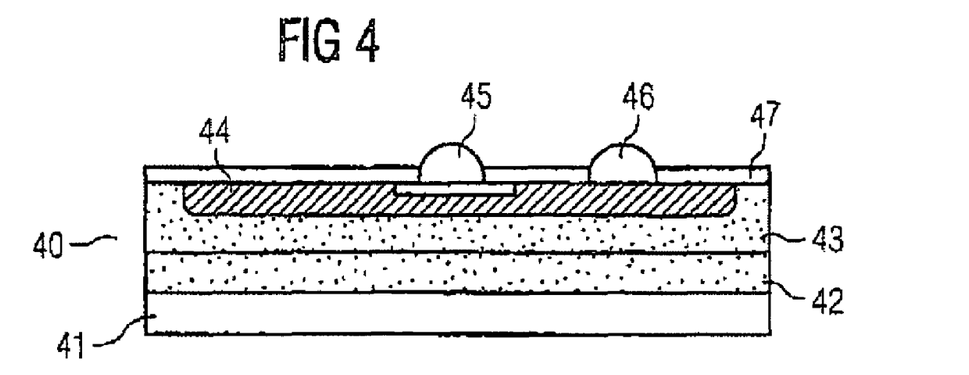
FIG. 4 shows a bipolar transistor.

This example shows a planar bipolar transistor 40 as shown in FIG. 4. This bipolar transistor 40 has, on a carrier material 41, first of all a first n-semiconducting layer 42 of inert matrix material and n-semiconducting inorganic particles, as well as a second, likewise n-semiconducting layer 43 of n-semiconducting inorganic particles embedded in an inert matrix material. The layer 42 forms the collector of the transistor. A layer 44, in which an inorganic p-semiconductor is embedded in an inert matrix material, is arranged on the second layer 42 or in this layer. The layer 44 forms the base of the transistor. Furthermore, the bipolar transistor 40 includes the required emitter electrode 45 and base electrode 46 with the associated emitter and base connections and a protective layer 47.

Exemplary Embodiment 5

Figure 5A:
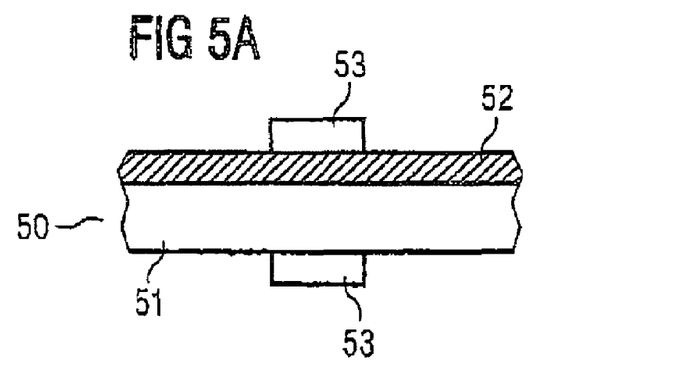
FIGS. 5A and 5B show a light-emitting diode.
Figure 5B:
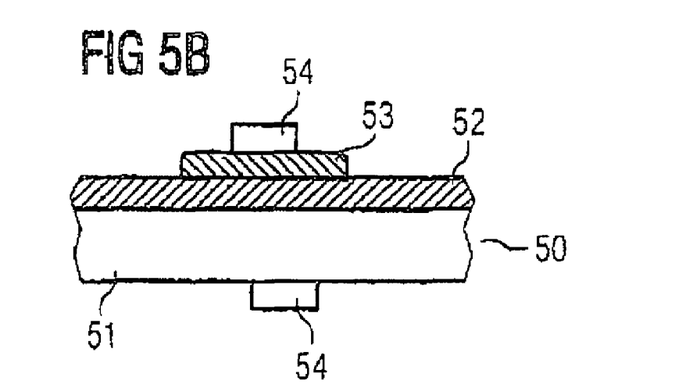

This example shows a light-emitting diode 50 as shown in FIG. 5. FIG. 5A shows a sectional view through a light-emitting diode 50 in which the substrate material used is an n-doped gallium arsenide single crystal 51 and to which a semiconducting layer 52 has been applied. The inorganic semiconducting material which is embedded in the semiconducting layer 52 in dispersed form is gallium arsenide doped with zinc (Zn). The zinc doping on the one hand makes the layer 52 p-conducting, and on the other hand the Zn doping also effects the formation of a diode which emits at a wavelength of 900 nm after contact has been made with the single crystal 51 and the layer 52, for example by means of a Cu/Ag ink 53. The diode 50 as shown in FIG. 5A is therefore at the same time an example of a substrate in which the substrate material itself is a semiconducting material.

FIG. 5B shows a sectional view through a diode 50 in which, first of all, a first semiconducting layer 52, in which gallium arsenide particles are embedded in an inert matrix material, has been applied to a carrier material 51, and then a second semiconducting layer 53, in which zinc-doped particles of gallium arsenide are embedded, has been applied. After contact has been made using a Cu/Ag ink 54, this diode 50 likewise emits infrared radiation with a wavelength of 900 nm.

FABRICATION EXAMPLE 1

This example is intended to explain the fabrication process claimed here.

N-conducting silicon (mean grain diameter 5 µm) is stirred into an aqueous polyacrylic acid solution (35% by weight), and a 200 µm-wide and 1 mm-long track 21 of the homogeneous suspension (n-ink) is printed through a stencil mask onto a polyethylene naphthalate film as substrate material, followed by drying in vacuo at 60° C. for 30 minutes. Then, p-conducting silicon (mean grain diameter 5 µm) is stirred into a polystyrene solution (solvent xylene), and the resulting p-ink is printed in a perpendicular arrangement with respect to the n-conducting track, followed by drying for 30 seconds under an IR radiator (output: 1000 W). A commercial Cu/Ag ink 23 is used to make contact with in each case one end of the n-conducting and p-conducting tracks. The diode fabricated in this way can be subjected to a load at 100 mA. The reverse voltage is 100 V.

FABRICATION EXAMPLE 2

This example explains the fabrication process for diodes as examples of components of the present invention and illustrates the properties of these diodes.

First of all, a solution is produced which contains an organic polymer as matrix material and semiconducting inorganic particles. For this purpose, 6 g of polystyrene and 24 g of n-doped silicon are dissolved or suspended in 70 ml of xylene by the suspension firstly being intensively shaken for 10 hours and then being homogenized for 20 min. in an ultrasound bath. The n-doped silicon used has a mean resistivity of r=4 Ωcm, 99% of the particles have a particle size of <15 µm (cf. FIG. 7B, in which the particle size distribution 706 in the form of the particle diameter 708 in µm is plotted against the cumulative percentage by volume 707 of the particles having the corresponding particle diameter).

Figure 7A:
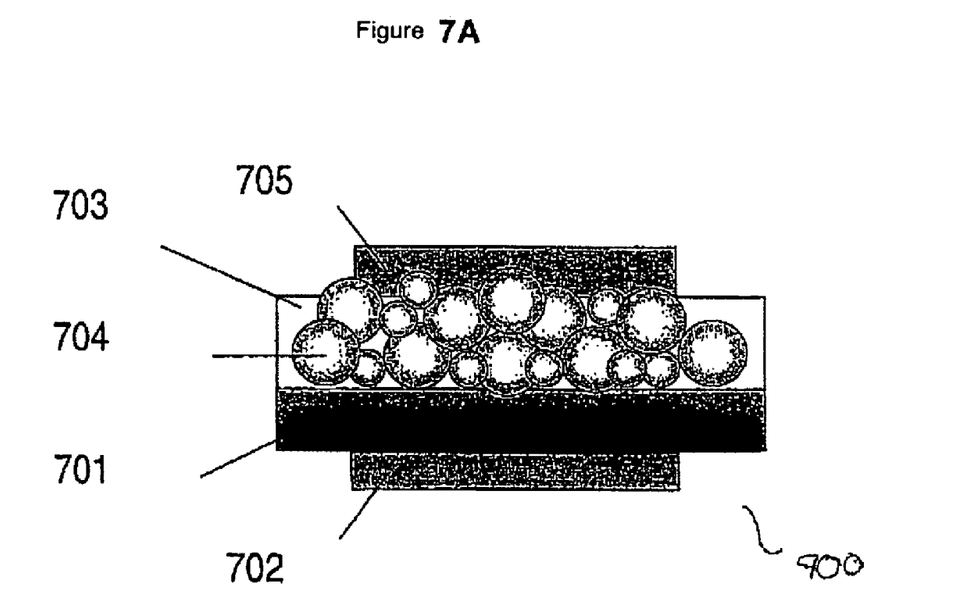
FIGS. 7A to 7C show diodes according to the invention produced in accordance with Fabrication Example 2 (FIG. 7A), the particle size distribution of the silicon particles which are embedded in a semiconducting layer of the diodes (FIG. 7C), and the current-voltage characteristic curve of the diodes (FIG. 7C).
Figure 7B:
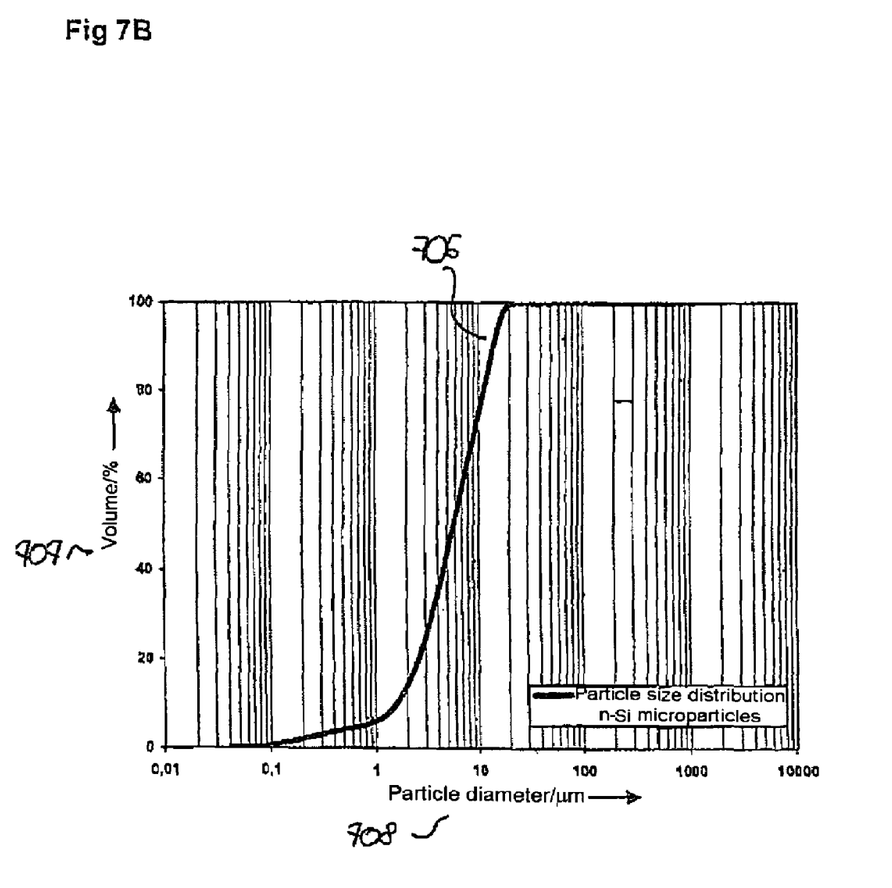

To fabricate the diode structure 700, first of all 100 nm of palladium are sputtered onto the entire back surface of a silicon wafer 701, in order to produce a definite ohmic contact with the aid of the palladium layer 702 formed in this way. Then, the suspension which contains the n-doped silicon is spun onto the front surface at 1000 rpm and dried for in each case 5 minutes at 100° C. and 120° C. on a hotplate. In the process, a 68 µm-thick layer 703 of electrically inert matrix material with semiconductor particles 704 embedded therein is obtained. A layer 705 of 100 nm of palladium is in turn sputtered onto this layer 703 through a shadow mask. The shadow mask defines round regions with a diameter of 2 mm.

Figure 7C:
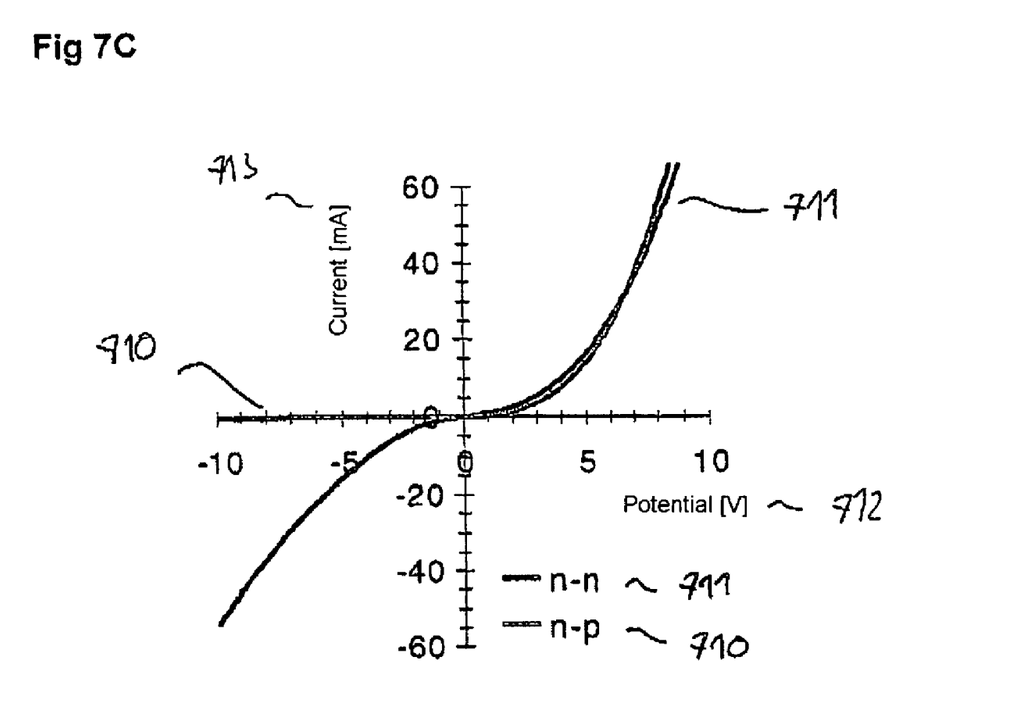

In this way, two diode structures 700 according to the invention were obtained using an n-doped silicon wafer 701 and a p-doped silicon wafer 701. A current/voltage characteristic curve (I/U characteristic curve) was recorded for both diodes. The I/U characteristic curve 710 of the diode structure which was fabricated using the p-conducting silicon wafer has an unambiguous p-n junction. The I/U characteristic curve 711 of the diode structure formed using the wafer of n-silicon is symmetrical. The ohmic characteristic deviation is determined by the energy barrier of the charge transfer between the particles.

The invention claimed is:

1. An electronic component comprising:
   two semiconducting layers, each of said layers consisting of an inert matrix material embedding an inorganic semiconducting material in particle form, wherein the inorganic semiconducting material in one layer differs from the inorganic semiconducting material in the other layer in having a different conductivity type doping and/or a different doping concentration of the same conductivity type, forming a semiconductor junction between the two semiconductor layers due to the different conductivity type doping and/or the different doping concentration of the same conductivity type in the two layers.

2. The electronic component as claimed in claim 1, further comprising selection of the inorganic semiconducting material from the group consisting of silicon, silicon carbide, germanium, gallium arsenide, gallium nitride, indium phosphide, and cadmium selenide.

3. The electronic component as claimed in claim 1, further comprising the inorganic semiconducting material having a particle size of between 100 µm and 10 nm.

4. The electronic component as claimed in claim 1, further comprising the semiconducting layer having an inorganic semiconducting material content of from 20 to 90% by volume, based on its total volume.

5. The electronic component as claimed in one of claims 1 to 4, further comprising the matrix material being selected from the group consisting of: an organic polymer, an inorganic material, and a mixture of an organic polymer and an inorganic material.

6. The electronic component as claimed in claim 5, further comprising selecting the organic polymer from the group consisting of epoxy resins, acrylates, polyimides, polybenzoxazoles, polystyrene and polyalkylenes.

7. The electronic component as claimed in claim 5, further comprising the inorganic matrix material being an inorganic ceramic material.

8. The electronic component as claimed in claim 1, in which the matrix material also includes a semiconducting organic material.

9. The electronic component as claimed in claim 1, further comprising a substrate material selected from the group consisting of: paper, plastic films, ceramics, glass, silica gel plates, also metal, plastic-coated metal, indium tin oxide, electrically conducting and electrically semiconducting substrate materials.

10. The electronic component as claimed in claim 1, in which the component is a diode or transistor.

11. The electronic component as claimed in claim 10, wherein the component is a transistor in which the source region, the drain region and the channel region of the transistor are each formed by a semiconducting layer which includes an inert matrix material in which an inorganic semiconducting material is embedded in particle form.

12. An electronic circuit having at least one electronic component as claimed in claim 1.

13. A process for fabricating an electronic component, the process comprises:
   forming two semiconducting layers, each of said layers consisting of an inert matrix material embedding an inorganic semiconducting material in particle form, wherein the inorganic semiconducting material in one layer differs from the inorganic semiconducting material in the other layer in having a different conductivity type doping and/or a different doping concentration of the same conductivity type, forming a semiconductor junction between the two semiconductor layers due to the different conductivity type doping and/or the different doping concentration of the same conductivity type in the two layers.

14. The process as claimed in claim 13, further comprising in suspending the inorganic semiconducting material in the inert matrix material until a homogeneous suspension has formed; and applying the suspension which contains the matrix material to a substrate material.

15. The process as claimed in claim 14, further comprising in providing the inert matrix material in a liquid; and suspending the inorganic semiconducting material in the liquid.

16. The process as claimed in claim 15, further comprising dissolving the inert matrix material in the liquid.

17. The process as claimed in claim 15, further comprising suspending the inert matrix material in the liquid.

18. The process as claimed in one of claims 15 to 17, in which the liquid is selected from the group consisting of an aqueous liquid, an organic liquid, a mixture of at least two organic liquids, and a mixture of aqueous and organic liquid.

19. The process as claimed in claim 15, further comprising transferring the mixture or suspension to a suitable printing or spraying device.

20. The process as claimed in claim 15, further comprising removing the liquid which contains the matrix material.

21. The process as claimed in claim 20, further comprising removing the liquid by means of IR irradiation and drying in vacuo.

22. The process as claimed in claim 21, further comprising solidifying the inert matrix material, wherein the inert matrix material is an organic polymer by curing.

23. The process as claimed in claim 13, further comprising the inorganic semiconducting material having a particle size of between 100 μm and 10 nm.

24. The process as claimed in claim 13, further comprising providing a substrate material, wherein the substrate material is selected from the group consisting of paper, plastic films, ceramics, glass, silica gel plates, also metal, plastic-coated metal, indium tin oxide, electrically conducting and electrically semiconducting substrate materials.

25. The process as claimed in claim 13, further comprising applying the inorganic semiconducting material embedded in the matrix material to a substrate by means of a printing process.

26. The process as claimed in claim 25, in which the printing process used is selected from the group consisting of pad printing, screen printing, stencil printing, inkjet printing, offset printing and laser printing.

27. The process as claimed in claim 13, wherein the step of providing the inorganic semiconducting material in particle form embedded in the inert matrix material, comprises:
    suspending the inorganic semiconducting material in the inert matrix material until a homogeneous suspension has formed, in which the semiconducting inorganic material is embedded in the matrix material.

\* \* \* \* \*